US009995799B2

(12) United States Patent
Hull

(10) Patent No.: US 9,995,799 B2
(45) Date of Patent: Jun. 12, 2018

(54) SYSTEM AND METHOD FOR MAGNETIC CHARACTERIZATION OF INDUCTION HEATING WIRES

(71) Applicant: The Boeing Company, Chicago, IL (US)

(72) Inventor: John R. Hull, Sammamish, WA (US)

(73) Assignee: The Boeing Company, Chicago, IL (US)

(*) Notice: Subject to any disclaimer, the term of this patent is extended or adjusted under 35 U.S.C. 154(b) by 244 days.

(21) Appl. No.: 14/798,676

(22) Filed: Jul. 14, 2015

(65) Prior Publication Data

US 2017/0016967 A1 Jan. 19, 2017

(51) Int. Cl.
*G01R 33/14* (2006.01)
*H05B 6/10* (2006.01)

(52) U.S. Cl.
CPC ............. *G01R 33/14* (2013.01); *H05B 6/105* (2013.01)

(58) Field of Classification Search
CPC ............. G01R 33/14; H05B 6/10; H05B 6/36
See application file for complete search history.

(56) References Cited

U.S. PATENT DOCUMENTS

| | | | | |
|---|---|---|---|---|
| 5,434,389 A | * | 7/1995 | Griebel | H05B 6/06 219/663 |
| 5,434,504 A | * | 7/1995 | Hollis | G01D 5/2046 324/207.17 |
| 5,948,978 A | * | 9/1999 | Feller | G01F 1/6842 324/706 |
| 6,037,576 A | * | 3/2000 | Okabayashi | G03G 15/2039 219/619 |
| 6,455,825 B1 | * | 9/2002 | Bentley | G05D 23/26 148/567 |
| 6,566,635 B1 | | 5/2003 | Matsen et al. | |
| 8,330,086 B2 | | 12/2012 | Miller et al. | |

(Continued)

OTHER PUBLICATIONS

*Standard Test Method for Alternating-Current Magnetic Properties of Materials at Power Frequencies Using Wattmeter-Ammeter-Voltmeter Method and 25-cm Epstein Test Frame*, ASTM A 343-97 (1997).

(Continued)

*Primary Examiner* — Son Le
*Assistant Examiner* — Akm Zakaria
(74) *Attorney, Agent, or Firm* — Walters & Wasylyna LLC

(57) ABSTRACT

A system for magnetic characterization of an induction heating wire including a conductor having a first end and a second end longitudinally opposed from the first end, wherein the induction heating wire extends along a portion of the conductor and is electrically isolated from the conductor, an alternating current power source electrically coupled with the conductor to pass an electric current between the first end and the second end, a current sensor positioned to sense the electric current, a sensing wire including a first lead and an opposed second lead, wherein the sensing wire defines a first loop having a first polarity and a second loop having a second, opposite polarity, the second loop being connected to the first loop at a crossover, and wherein the induction heating wire extends through the first loop, and a voltage sensor positioned to sense a voltage across the first lead and the second lead.

20 Claims, 8 Drawing Sheets

(56) References Cited

U.S. PATENT DOCUMENTS

2003/0121908 A1* 7/2003 Pilavdzic ............... B29C 45/74
 219/630
2010/0303612 A1* 12/2010 Bhatnagar ............... F01D 11/22
 415/127

OTHER PUBLICATIONS

*Standard Test Method for Alternating Current Magnetic Properties of Materials Using the Wattmeter-Ammeter-Voltmeter Method, 100 to 10 000 Hz and 25-cm Epstein Frame*, ASTM A348/A348M-05 (2011).
*Methods of measurement of the magnetic properties of electrical steel strip and sheet by means of an Epstein frame*, International Standard IEC 60404-2 (2008).

* cited by examiner

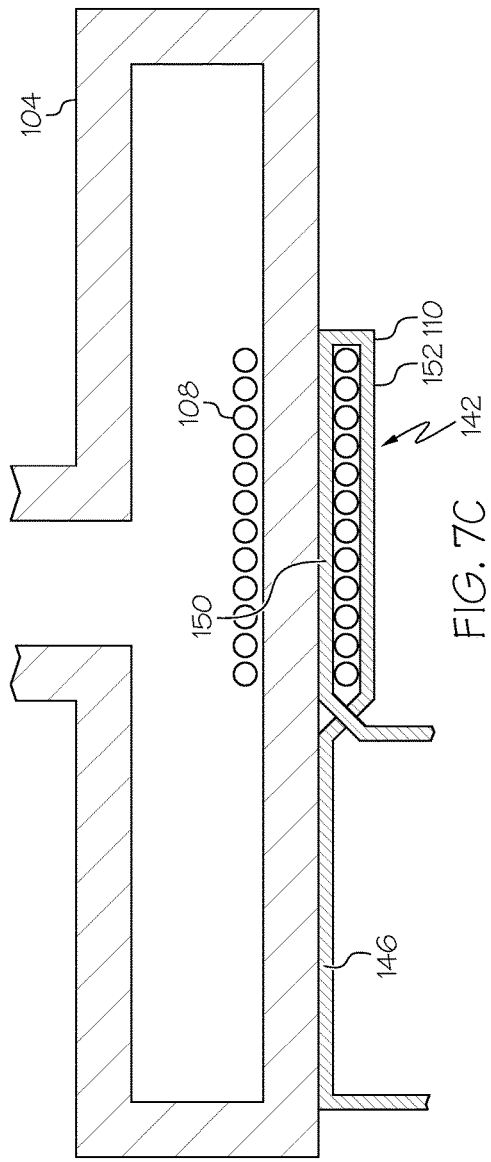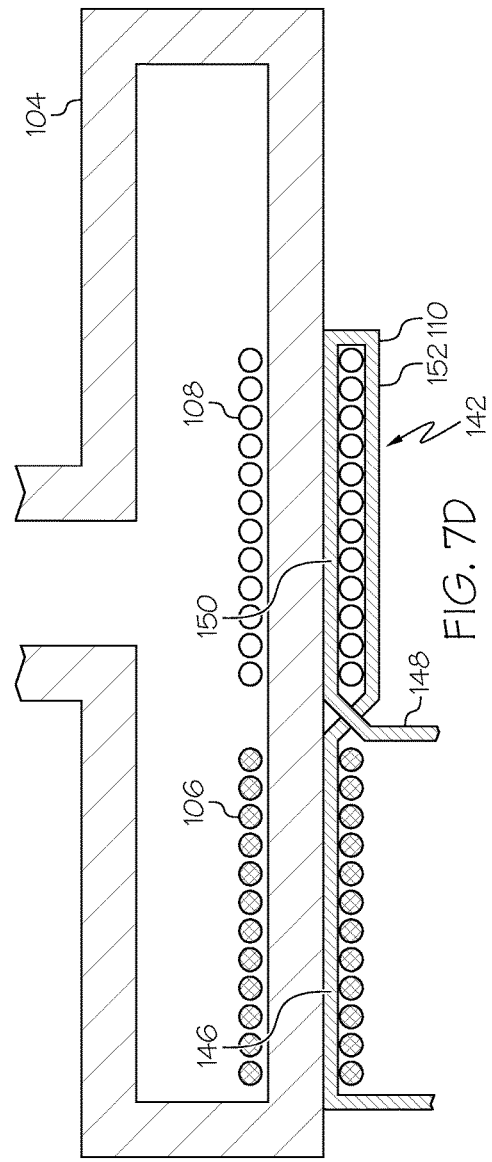

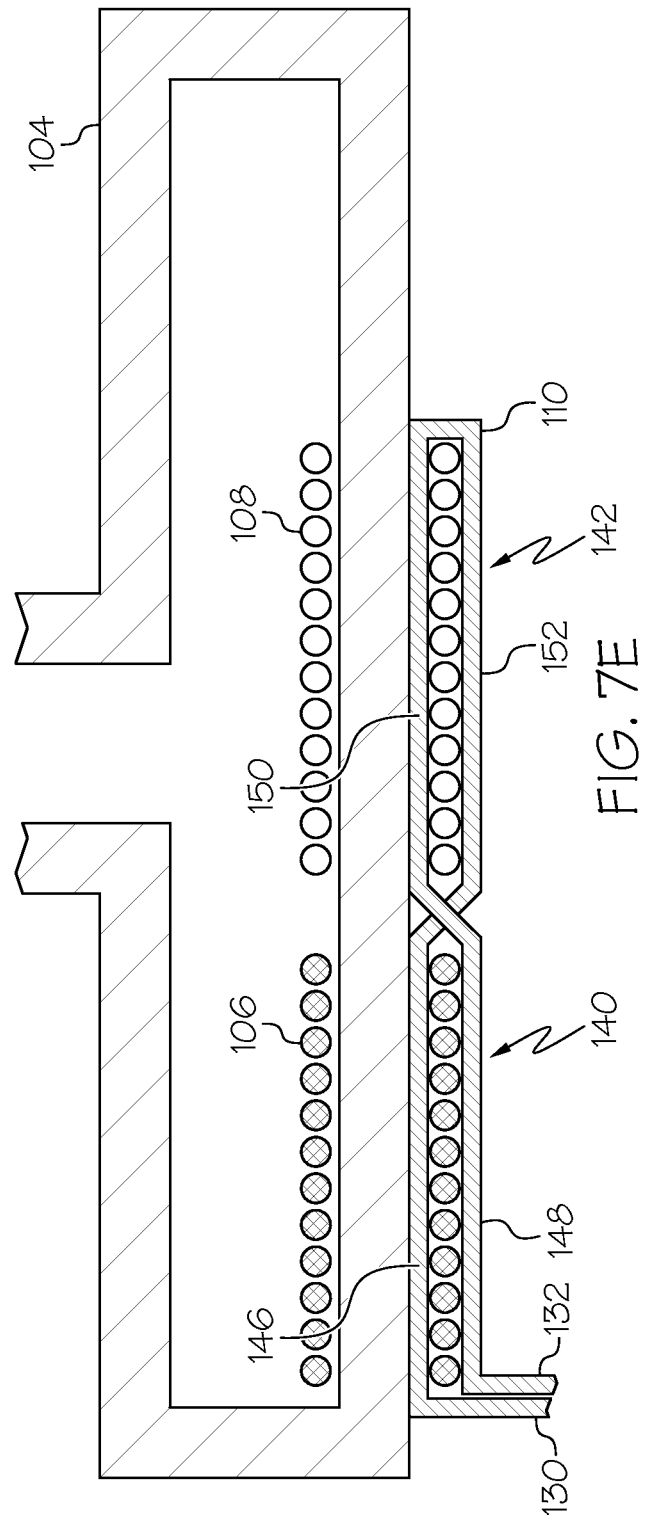

SYSTEM AND METHOD FOR MAGNETIC CHARACTERIZATION OF INDUCTION HEATING WIRES

FIELD

This application relates to magnetic characterization and, more particularly, to magnetic characterization of induction heating wires, particularly spirally wrapped induction heating wires.

BACKGROUND

Induction heating assemblies employ electromagnetic induction to generate heat. Specifically, induction heating assemblies include a conductor and an induction heating wire extending along (in close proximity to) the conductor. When an alternating electric current is passed through the conductor, an alternating magnetic field is established, which heats the induction heating wire by way of eddy currents and magnetic hysteresis.

Thus, induction heating assemblies are used in various applications that require heating, such as curing of composite structures (e.g., carbon-fiber-reinforced composites comprising thermoset resins) and heating of parts (e.g., preheating parts to be welded). For example, an induction heating assembly can be connected to (e.g., incorporated into or layered over) an insulating substrate (e.g., silicone rubber) to form an induction heating blanket. When the magnetic characteristics of the induction heating assembly at various temperatures are known, the alternating electric current supplied to the induction heating assembly may be controlled such that the associated induction heating blanket supplies the desired amount of heat.

Recently, induction heating assemblies have been manufactured in which the induction heating wire is spirally wrapped around the conductor (e.g., forms a helical coil around the conductor). Such a configuration advantageously positions the induction heating wire in particularly close proximity to the conductor.

However, unlike straight induction heating wires that can be precisely magnetically characterized using known equipment, such as an Epstein frame, magnetic characterization of spirally wrapped induction heating wires presents a challenge. The Epstein frame does not provide precise magnetic characterization of spirally wrapped induction heating wires. Furthermore, magnetic characterization of an induction heating wire prior to winding fails to account for the changes in magnetic properties that occur due to work hardening that is introduced by the winding process.

Accordingly, those skilled in the art continue with research and development efforts in the field of magnetic characterization.

SUMMARY

In one embodiment, the disclosed system for magnetic characterization of an induction heating wire may include a conductor having a first end and a second end longitudinally opposed from the first end, wherein the induction heating wire extends along a portion of the conductor and is electrically isolated from the conductor, an alternating current power source electrically coupled with the conductor to pass an electric current between the first end and the second end, a current sensor positioned to sense the electric current, a sensing wire including a first lead and an opposed second lead, wherein the sensing wire defines a first loop having a first polarity and a second loop having a second, opposite polarity, the second loop being connected to the first loop at a crossover, and wherein the induction heating wire extends through the first loop, and a voltage sensor positioned to sense a voltage across the first lead and the second lead.

In another embodiment, the disclosed system for magnetic characterization of an induction heating wire may include a conductor defining a longitudinal axis, the conductor including a first end and a second end longitudinally opposed from the first end, wherein the induction heating wire extends along a portion of the conductor and is electrically isolated from the conductor, an alternating current power source electrically coupled with the conductor to pass an electric current between the first end and the second end, a current sensor positioned to sense the electric current, a sensing wire including a first lead and an opposed second lead, wherein the sensing wire defines a first loop having a first polarity and including a first segment and a second segment, the second segment being spaced apart from the first segment, wherein a portion of the induction heating wire is positioned between the first segment and the second segment, and a second loop having a second polarity opposite of the first polarity, the second loop including a third segment and a fourth segment, the fourth segment being spaced apart from the third segment, and a voltage sensor positioned to sense a voltage across the first lead and the second lead.

In yet another embodiment, disclosed is a method for magnetic characterization of an induction heating wire, the induction heating wire being spirally wrapped around a conductor. The method may include the steps of (1) arranging a sensing wire into a first loop and a second loop, the second loop being connected to the first loop at a crossover such that the first loop has a first polarity and the second loop has a second polarity opposite of the first polarity; (2) positioning the sensing wire along the conductor such that the induction heating wire extends through the first loop; (3) positioning a spacer in the second loop; (4) passing an alternating electric current through the conductor; (5) sensing the electric current; (6) sensing a voltage across the sensing wire; and (7) characterizing the induction heating wire based at least on the sensed electric current and the sensed voltage.

Other embodiments of the disclosed system and method for magnetic characterization of induction heating wires will become apparent from the following detailed description, the accompanying drawings and the appended claims.

BRIEF DESCRIPTION OF THE DRAWINGS

FIGS. 7A-7E are schematic side cross-sectional views depicting one embodiment of the disclosed method for assembling a magnetic characterization system.

DETAILED DESCRIPTION

Figure 1:
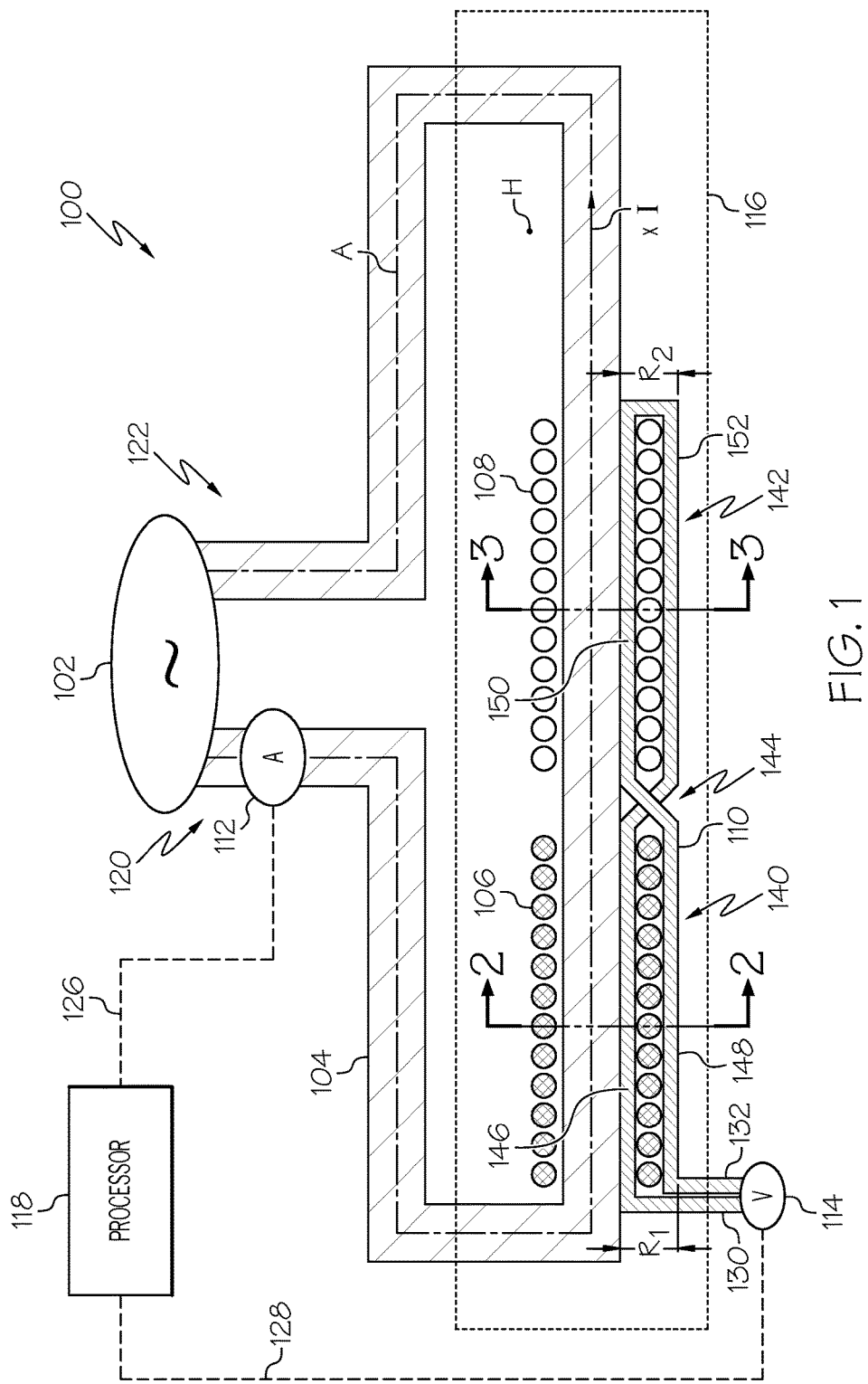
FIG. 1 is a schematic side cross-sectional view of one embodiment of the disclosed magnetic characterization system.

Referring to FIG. 1, one embodiment of the disclosed magnetic characterization system, generally designated 100, may include an alternating current power source 102, a conductor 104, an induction heating wire 106, a spacer 108, a sensing wire 110, a current sensor 112, a voltage sensor 114 and a heating apparatus 116. The magnetic characterization system 100 may further include a processor 118 (e.g., a computer) to receive and process signal data from the current sensor 112 and the voltage sensor 114, and to output the desired magnetic characterization information.

Those skilled in the art will appreciate that additional components, such as redundant current and/or voltage sensors, may be included in the magnetic characterization system 100 without departing from the scope of the present disclosure. Furthermore, certain components, such as the spacer 108 and/or the heating apparatus 116, may be omitted from the magnetic characterization system 100 without departing from the scope of the present disclosure.

The conductor 104 may be elongated along a longitudinal axis A, and may include a first end 120 and a second end 122 longitudinally opposed from the first end 120. The conductor 104 may be a length of electrically conductive material, such as a solid wire or a stranded wire. For example, the conductor 104 may be formed from (or may include) an electrically conductive metal or metal alloy, such as copper. As one specific, non-limiting example, the conductor 104 may be a Litz wire (see FIGS. 2 and 3)), which may include multiple fine filaments, with each filament being electrically insulated from the other filaments.

Figure 2:
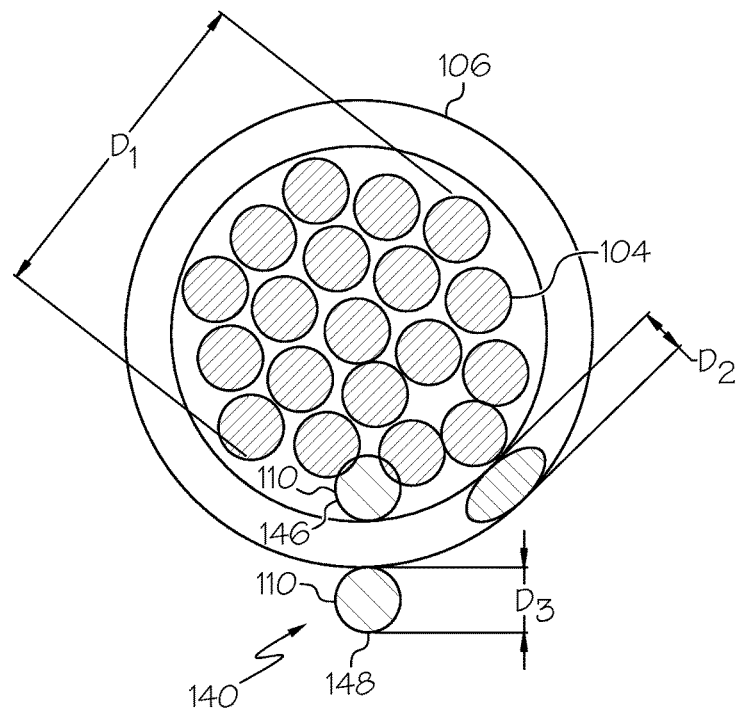
FIG. 2 is an axial view, in cross-section, of one portion of the magnetic characterization system of FIG. 1.

As shown in FIG. 2, the conductor 104 may have a diameter $D_1$, which may be greater than the diameter $D_2$ of the induction heating wire 106 and the diameter $D_3$ of the sensing wire 110. In one expression, the diameter $D_1$ of the conductor 104 may range from about 0.010 inch to about 0.10 inch. In another expression, the diameter $D_1$ of the conductor 104 may range from about 0.020 inch to about 0.050 inch. In yet another expression, the diameter $D_1$ of the conductor 104 may be about 0.030 inch.

Referring back to FIG. 1, the first end 120 of the conductor 104 and the second end 122 of the conductor 104 may be electrically coupled with the alternating current power source 102. Therefore, an alternating electric current may pass through the conductor 104, as shown by arrow I.

The frequency of the alternating electric current I may be controllable at the alternating current power source 102. Because magnetic permeability is independent of alternating electric current frequency, the alternating current power source 102 may be controlled such that the alternating electric current I has a relatively low frequency, thereby minimizing heat generation by way of electromagnetic induction. For example, the alternating electric current I passing through the conductor 104 may have a frequency of at most about 100 kHz, such as at most about 50 kHz or at most about 25 kHz. As one specific, non-limiting example, the alternating electric current I passing through the conductor 104 may have a frequency of about 10 kHz.

The alternating electric current I passing through the conductor 104 may be sensed by the current sensor 112 (e.g., an ammeter). While the current sensor 112 is shown in series with the conductor 104, various other configurations (e.g., a clamp-on type or current transformer) may be used without departing from the scope of the present disclosure. A signal indicative of the alternating electric current I may be communicated from the current sensor 112 to the processor 118, such as by way of a communication path 126, which may be wired or wireless.

The alternating electric current I passing through the conductor 104 may establish a magnetic field H that passes azimuthally around the conductor 104. In FIG. 1, the magnetic field H is represented by a dot (field coming out of the page) and an "x" (field going into the page). The magnetic field H is proportional to the alternating electric current I and reverses direction (alternates) with the alternating electric current I.

The induction heating wire 106 may axially extend along a portion of the conductor 104 in close proximity to the conductor 104, but may be electrically isolated from the conductor 104. The induction heating wire 106 may be formed from (or may include) a ferromagnetic material, such as ferromagnetic material capable of being wrapped the conductor 104, as is discussed herein. For example, the induction heating wire 106 may be formed from (or may include) iron (Fe), nickel (Ni) and/or cobalt (Co). Therefore, the alternating magnetic field H may produce a magnetic response in the induction heating wire 106.

As shown in FIGS. 1 and 2, in one particular construction, the induction heating wire 106 may be spirally wrapped around the conductor 104. Therefore, the induction heating wire 106 may be effectively configured as a helical coil received over a portion of the conductor 104. As one general example, the induction heating wire 106 may be wrapped around the conductor 104 to achieve about 10 to about 100 turns per inch of conductor 104. As one specific example, the induction heating wire 106 may be wrapped around the conductor 104 to achieve about 50 turns per inch of conductor 104.

As shown in FIG. 2, in a first realization, the induction heating wire 106 may have a diameter $D_2$, which may be less than the diameter $D_1$ of the conductor 104. In one expression of the first realization, the diameter $D_2$ of the induction heating wire 106 may be at most about 75 percent of the diameter $D_1$ of the conductor 104. In another expression, the diameter $D_2$ of the induction heating wire 106 may be at most about 50 percent of the diameter $D_1$ of the conductor 104. In another expression, the diameter $D_2$ of the induction heating wire 106 may be at most about 40 percent of the diameter $D_1$ of the conductor 104. In another expression, the diameter $D_2$ of the induction heating wire 106 may range from about 0.005 inch to about 0.050 inch. In another expression, the diameter $D_2$ of the induction heating wire 106 may range from about 0.010 inch to about 0.020 inch. In yet another expression, the diameter $D_2$ of the induction heating wire 106 may be about 0.010 inch.

In a second realization, the induction heating wire 106 may have a diameter $D_2$, which may be substantially the same as, or greater than, the diameter $D_1$ of the conductor 104. In one expression of the second realization, the diameter $D_2$ of the induction heating wire 106 may be at least about 110 percent of the diameter $D_1$ of the conductor 104. In another expression, the diameter $D_2$ of the induction heating wire 106 may be at least about 150 percent of the diameter $D_1$ of the conductor 104.

Referring back to FIG. 1, the sensing wire 110 may be an elongated length of electrically conductive material having a first lead 130 (at a first end of the sensing wire 110) and a second lead 132 (at an opposed second end of the sensing wire 110). For example, the sensing wire 110 may be a solid wire or a stranded wire. The sensing wire 110 may be formed from (or may include) an electrically conductive metal or metal alloy, such as copper.

As shown in FIG. 2, the sensing wire 110 may have a diameter $D_3$, which may be less than the diameter $D_1$ of the conductor 104. The diameter $D_3$ of the sensing wire 110 may also be less than the diameter $D_2$ of the induction heating wire 106. In one expression, the diameter $D_3$ of the sensing wire 110 may be at most about 50 percent of the diameter $D_1$ of the conductor 104. In another expression, the diameter $D_3$ of the sensing wire 110 may be at most about 35 percent of the diameter $D_1$ of the conductor 104. In yet another expression, the diameter $D_3$ of the sensing wire 110 may range from about 0.006 inch to about 0.010 inch.

As noted herein, the conductor 104 may be a Litz wire. Therefore, by selecting a sensing wire 110 having a diameter $D_3$ significantly less than the diameter $D_1$ of the conductor 104, the sensing wire 110 (or at least a portion thereof) may be compressed into the conductor 104, thereby yielding a combined structure that remains essentially round (in cross-section) with a diameter substantially similar to (e.g., not significantly larger than) the diameter $D_1$ of the conductor 104, alone, as shown in FIG. 2.

Referring back to FIG. 1, the sensing wire 110 may be arranged into two substantially equal loops: a first loop 140 and a second loop 142. The second loop 142 may be connected to the first loop 140 at a crossover 144. For example, the sensing wire 110 may be configured as a "figure eight." Therefore, the first loop 140 may have a first polarity and the second loop 142 may have a second polarity, wherein the second polarity is opposite of the first polarity.

The first loop 140 formed by the sensing wire 110 may by positioned adjacent the conductor 104, and may include a first segment 146 of the sensing wire 110 and a second segment 148 of the sensing wire 110. The second loop 142 may by positioned adjacent the conductor 104, and may include a third segment 150 of the sensing wire 110 and a fourth segment 152 of the sensing wire 110. The first lead 130 may be connected to the first segment 146, which may be connected to the fourth segment 152 across the crossover 144. The opposite end of the fourth segment 152 may be connected to the third segment 150, which in turn may be connected to the second segment 148 across the crossover 144. The opposite end of the second segment 148 may be connected to the second lead 132.

To ensure the first loop 140 has an equal and opposite polarity from the second loop 142, each segment 146, 148, 150, 152 may have substantially the same length. The first segment 146 and the second segment 148 may be located at the same axial position relative to the conductor 104, while the third segment 150 and the fourth segment 152 may be located at the same axial position relative to the conductor 104, but axially adjacent to the first segment 146 and the second segment 148. Furthermore, the first segment 146 and third segment 150 may be positioned at the same radial position relative to the conductor 104. Still furthermore, the second segment 148 may be spaced a first radial distance $R_1$ outward (relative to the longitudinal axis A of the conductor 104) from the first segment 146, and the fourth segment 152 may be spaced a second radial distance $R_2$ outward from the third segment 150, wherein the first radial distance $R_1$ is substantially equal to the second radial distance $R_2$.

As shown in FIGS. 1 and 2, the induction heating wire 106 may extend through the first loop 140 defined by the sensing wire 110 (between the first segment 146 and the second segment 148). Therefore, the first segment 146 of the first loop 140 may be positioned between the conductor 104 and the induction heating wire 106, while the second segment 148 may be positioned radially outside of the induction heating wire 106. As such, the induction heating wire 106 may define the radial distance $R_1$ between the first segment 146 and the second segment 148.

Figure 3:
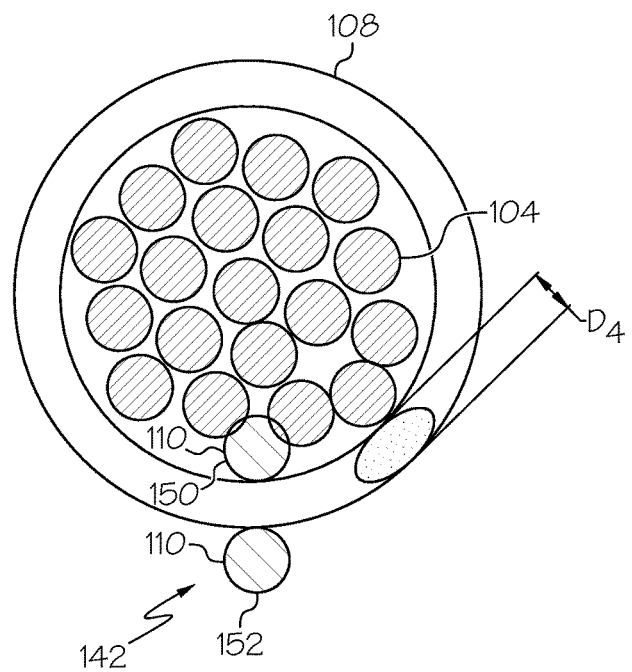
FIG. 3 is an axial view, in cross-section, of another portion of the magnetic characterization system of FIG. 1.

As shown in FIGS. 1 and 3, the spacer 108 may extend through the second loop 142 defined by the sensing wire 110 (between the third segment 150 and the fourth segment 152). Therefore, the third segment 150 of the second loop 142 may be positioned between the conductor 104 and the spacer 108, while the fourth segment 152 may be positioned radially outside of the spacer 108. As such, the spacer 108 may ensure that the radial distance $R_2$ between the third segment 150 and the fourth segment 152 is substantially the same as the radial distance $R_1$ between the first segment 146 and the second segment 148.

The spacer 108 may be formed from a non-ferromagnetic material. For example, the spacer 108 may be formed from (or may include) a non-ferromagnetic metal (e.g., copper) or a non-metal (e.g., glass fiber). Therefore, no magnetic response may be induced in the spacer 108 due to the alternating magnetic field H.

In one particular implementation, the spacer 108 may be a length of non-ferromagnetic material spirally wrapped around the conductor 104. Like the axially adjacent induction heating wire 106, the spacer 108 may be effectively configured as a helical coil received over a portion of the conductor 104. The diameter $D_4$ (FIG. 3) of the spacer 108 may be substantially equal to the diameter $D_2$ (FIG. 2) of the induction heating wire 106. Therefore, the spacer 108 may maintain the desired radial distance $R_2$ between the third segment 150 and the fourth segment 152 of the second loop 142.

Referring back to FIG. 1, the voltage across the first lead 130 and the second lead 132 of the sensing wire 110 may be sensed by the voltage sensor 114 (e.g., a voltmeter). A signal indicative of the voltage across the first and second leads 130, 132 may be communicated from the voltage sensor 114 to the processor 118, such as by way of a communication path 128, which may be wired or wireless.

The alternating magnetic field H established by the alternating electric current I passing through the conductor 104 produces a magnetic response in the induction heating wire 106. The changing magnetic flux in the induction heating wire 106 produces a voltage across the first and second leads 130, 132, as prescribed by Faraday's Law of Induction. This voltage may be sensed by the voltage sensor 114.

The alternating magnetic field H established by the alternating electric current I passing through the conductor 104, which also cuts across the segments 146, 148, 150, 152 of sensing wire 110, also produces a voltage across the first and second leads 130, 132. The voltage from this background magnetic field H can cause a significant uncertainty in the measurement of the magnetic response of the induction heating wire 106. However, because the first loop 140 of the sensing wire 110 is equally and oppositely polarized to the second loop 142, the voltages produced by the first and second loops 140, 142 will be opposite in sign.

Thus, when the total length and radial distance $R_1$, $R_2$ of each loop 140, 142 is substantially the same, the voltage induced in the sensing wire 110 by the applied magnetic field H that is not contributed by the induction heating wire 106 is canceled out. As such, the voltage sensor 114 only senses the magnetic response of the induction heating wire 106.

Figure 4:
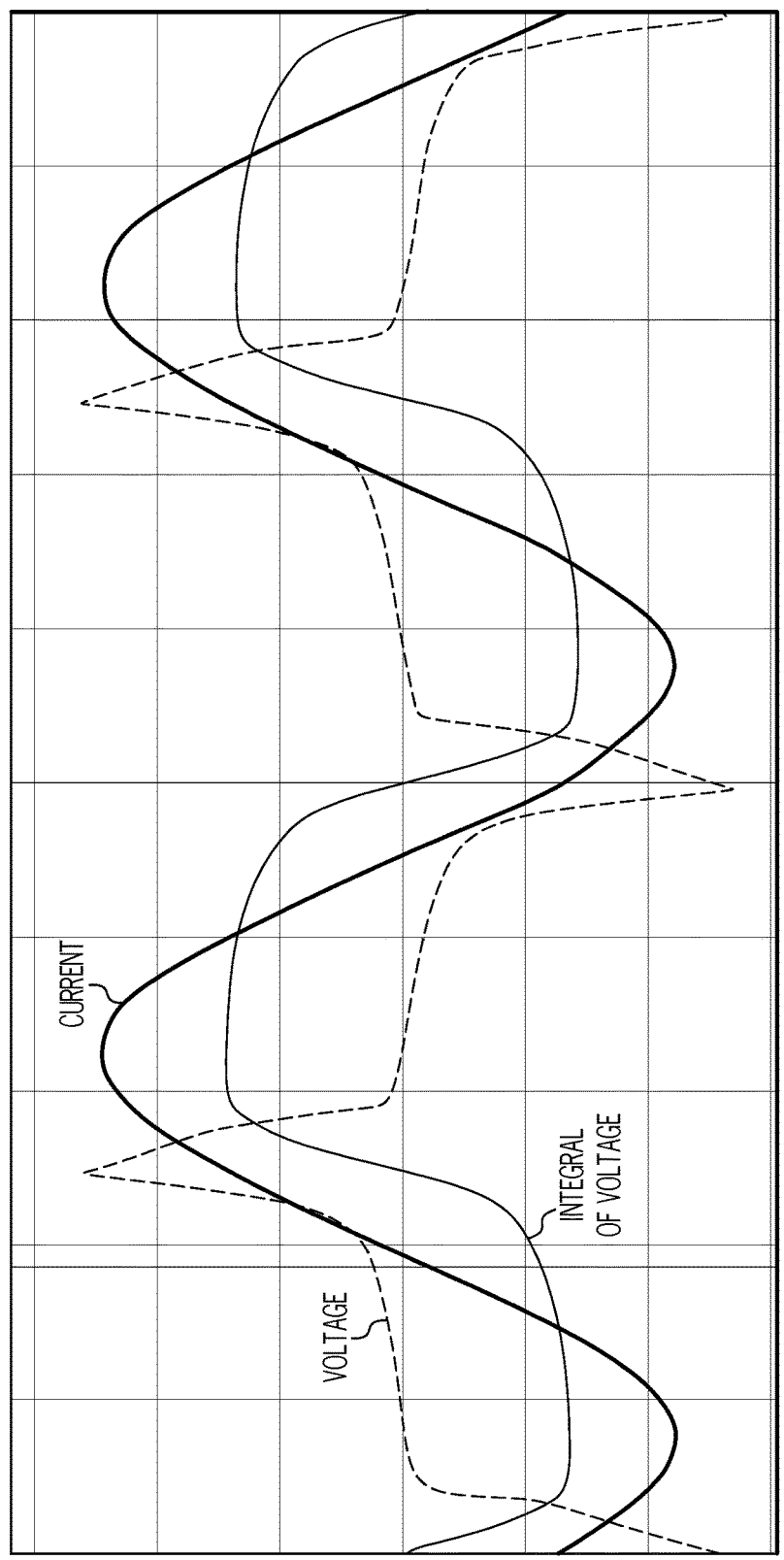
FIG. 4 is a graphical representation of example data collected by the magnetic characterization system of FIG. 1.
Figure 5:
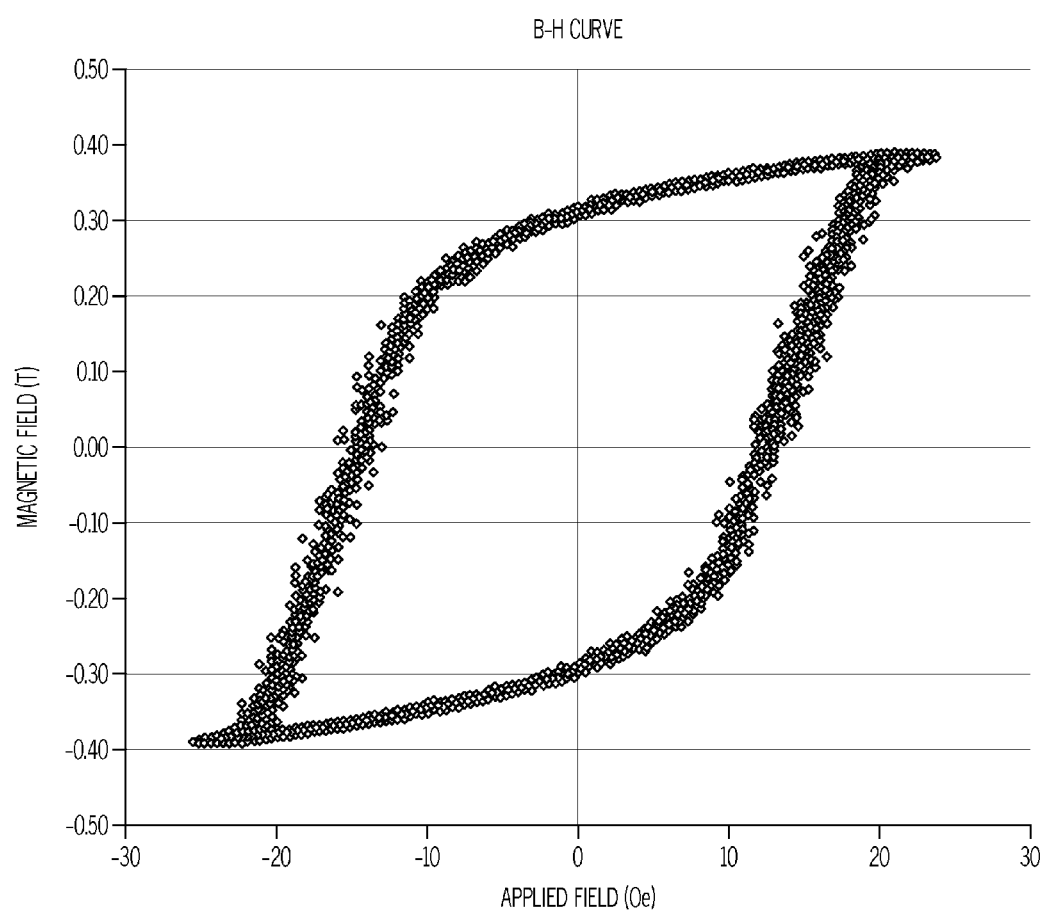
FIG. 5 is a B-H curve generated from the example data of FIG. 4.

Referring to FIG. 4, a magnetic characterization may be made by recording (by way of the current sensor 112 (FIG. 1) and the voltage sensor 114 (FIG. 1)) the current I as a function of time and the voltage across leads 130, 132 as a function of time. The current I and voltage data may be collected over one or more complete frequency cycles. The applied magnetic field H is directly proportional to, and in phase with, the current I. The magnetic response, in terms of the total magnetic flux in the induction heating wire 106, is proportional to the time integral of the voltage (the area under the voltage versus time plot). The average magnetic field B in the wires may be derived by dividing the magnetic flux by the total area of the wires in a given cross-section inside of the first loop 140. As shown in FIG. 5, the B-H curve may be derived by plotting the average magnetic field B versus the applied magnetic field H. The B-H curve is indicative of magnetic permeability and magnetic hysteresis, and may be useful in design calculations.

It is often advantageous to know the magnetic response at different temperatures. Therefore, the conductor 104, the induction heating wire 106, the spacer 108 and the sensing wire 110 may be placed into the heating apparatus 116, which may be controlled to a desired measurement temperature. For example, the heating apparatus 116 may be (or may include) an oven or furnace. A magnetic characterization may be made performed at various temperatures by controlling the temperature of the heating apparatus 116.

Also disclosed is a magnetic characterization method. The disclosed magnetic characterization method may be used to magnetically characterize an induction heating wire that is (or may become) part of an induction heating assembly, which includes the induction heating wire, a conductor and an alternating current power source. In one particular implementation, the induction heating wire to be magnetically characterized may be spirally wrapped around a conductor (see FIGS. 1 and 2).

Figure 6:
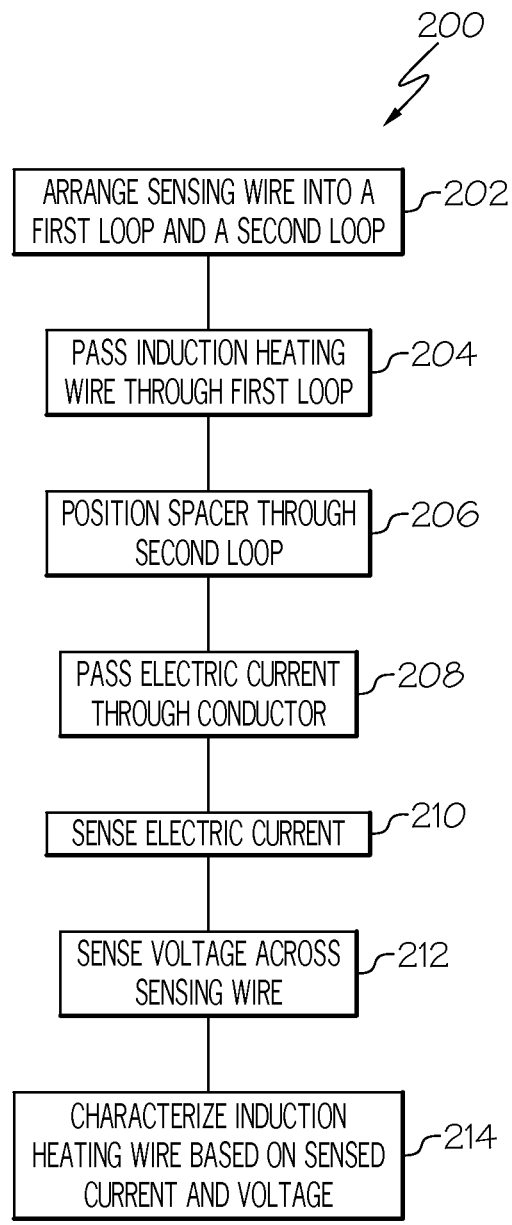
FIG. 6 is a flow diagram depicting one embodiment of the disclosed magnetic characterization method.

Referring to FIG. 6, with additional reference to FIG. 1, one embodiment of the disclosed magnetic characterization method, generally designated 200, may begin at Block 202 with the step of arranging a sensing wire 110 into a first loop 140 and a second loop 142, wherein the second loop 142 is connected to the first loop 140 at a crossover 144. The size and shape of both loops 140, 142 may be substantially equal such that the first loop 140 has a first polarity and the second loop 142 has a second, opposite polarity.

At Block 204, the sensing wire 110 may be positioned along the conductor 104 such that the induction heating wire 106 passes through the first loop 140 defined by the sensing wire 110. Therefore, the induction heating wire 106 may space a second segment 148 of the sensing wire 110 a first radial distance $R_1$ outward from a first segment 146 of the sensing wire 110.

At Block 206, a spacer 108 may be positioned in the second loop 142 defined by the sensing wire 110. The spacer 108 may space a fourth segment 152 of the sensing wire 110 a second radial distance $R_2$ outward from a third segment 150 of the sensing wire 110, and may ensure the second radial distance $R_2$ is substantially equal to the first radial distance $R_1$.

At Block 208, an alternating electric current I may be passed through the conductor 104. The alternating electric current I passing through the conductor 104 may establish an alternating magnetic field H that passes azimuthally around the conductor 104. The alternating magnetic field H may produce a magnetic response in the induction heating wire 106, which produces a voltage across the first and second leads 130, 132 of the sensing wire 110.

At Block 210, the alternating electric current I passing through the conductor 104 may be sensed. For example, a current sensor 112 may be positioned to sense the alternating electric current I passing through the conductor 104.

At Block 212, the voltage across the first and second leads 130, 132 of the sensing wire 110 may be sensed. For example, a voltage sensor 114 may be positioned to sense the voltage across the first and second leads 130, 132 of the sensing wire 110.

At Block 214, the induction heating wire 106 may be magnetically characterized based at least upon the sensed alternating electric current I passing through the conductor 104 and the sensed voltage across the first and second leads 130, 132 of the sensing wire 110. For example, the B-H curve may be derived by plotting the average magnetic field B versus the applied magnetic field H and/or the magnetic permeability may be calculated. The characterizing step 214 may be repeated at various temperatures.

Figure 7A:
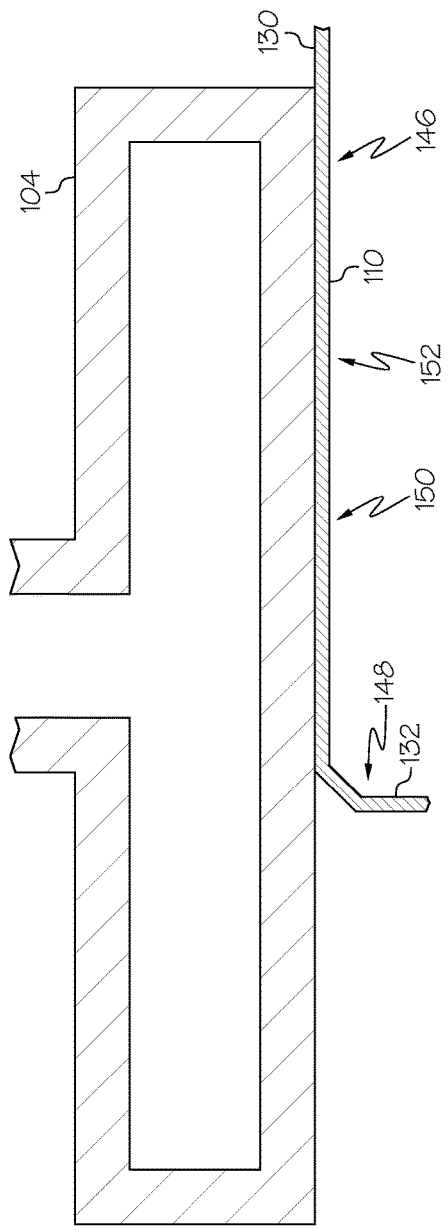

Referring to FIGS. 7A-7E, also disclosed is a method for assembling a magnetic characterization system. As shown in FIG. 7A, the assembly method may begin by providing a sensing wire 110 having (from end-to-end) a first lead 130, a first segment 146, a fourth segment 152, a third segment 150, a second segment 148 and a second lead 132.

Figure 7B:
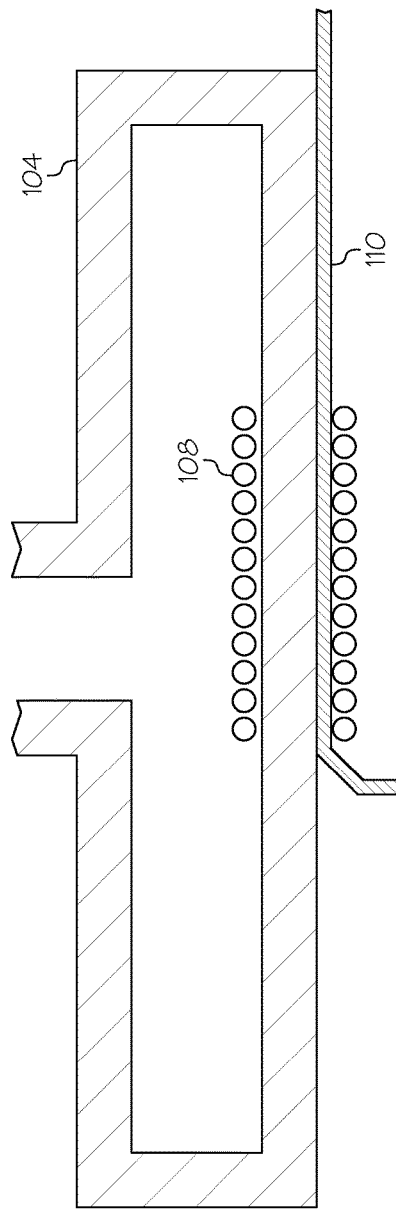

Still referring to FIG. 7A, the third segment of the sensing wire 110 may be positioned along (and adjacent to) a conductor 104. As shown in FIG. 7B, a spacer 108 may be spirally wrapped around a first portion of the conductor 104 and the third segment 150 of the sensing wire 110. As shown in FIG. 7C, a fourth segment 152 of the sensing wire 110 may be laid over the spacer 108, thereby forming a second loop 142. The second loop 142 may include the fourth segment 152 spaced radially outward from the third segment 150, with the spacer 108 positioned between the third segment 150 and the fourth segment 152.

Still referring to FIG. 7C, after the second loop 142 has been formed, a first segment of the sensing wire 110 may be positioned along (and adjacent to) the conductor 104. As shown in FIG. 7D, the induction heating wire 106 to be magnetically characterized may be spirally wrapped around a second portion of the conductor 104 (adjacent the first portion, which supports the spacer 108) and the first segment of the sensing wire 110.

As shown in FIG. 7E, a second segment 148 of the sensing wire 110 may be laid over the induction heating wire 106, thereby forming a first loop 140. The first loop 140 may include the second segment 148 spaced radially outward from the first segment 146, with the induction heating wire 106 positioned between the first segment 146 and the second segment 148.

Accordingly, disclosed is a system and method for magnetic characterization of induction heating wires, including helical (spiral-wrapped) induction heating wires. Significantly, the disclosed system and method may be used to precisely measure the magnetic response of a spiral-wrapped induction heating wire in the geometry in which it will be used in practice (wrapped around a current-carrying conductor). The presence of the sensing wire may minimally affect the geometry of the system, yet cancels out the background response from the magnetic field produced by the current-carrying conductor, thus making the measured response primarily (if not only) that of the induction heating wire.

Although various embodiments of the disclosed system and method for magnetic characterization of induction heating wires have been shown and described, modifications may occur to those skilled in the art upon reading the specification. The present application includes such modifications and is limited only by the scope of the claims.

What is claimed is:
1. A system for magnetic characterization of an induction heating wire comprising:

a conductor defining a longitudinal axis, said conductor comprising a first end and a second end longitudinally opposed from said first end, wherein said induction heating wire extends along a portion of said conductor and is electrically isolated from said conductor;

an alternating current power source electrically coupled with said conductor to pass an alternating electric current between said first end and said second end;

a current sensor positioned to sense said alternating electric current;

a sensing wire comprising a first lead and an opposed second lead, wherein said sensing wire is electrically isolated from said induction heating wire, wherein said sensing wire defines:

a first loop having a first polarity and comprising a first segment and a second segment, said second segment being spaced apart from said first segment, wherein a portion of said induction heating wire is positioned between said first segment and said second segment; and a second loop having a second polarity opposite of said first polarity, said second loop comprising a third segment and a fourth segment, said fourth segment being spaced apart from said third segment; and a voltage sensor positioned to sense a voltage across said first lead and said second lead.

2. The system of claim 1 wherein said induction heating wire is spirally wrapped around said portion of said conductor.

3. The system of claim 1 wherein said second segment is spaced a first radial distance outside of said first segment, and wherein said fourth segment is spaced a second radial distance outside of said third segment.

4. The system of claim 3 wherein said first radial distance is substantially equal to said second radial distance.

5. The system of claim 1 wherein said conductor comprises a Litz wire.

6. The system of claim 1 wherein said conductor has a first diameter, said induction heating wire has a second diameter and said sensing wire has a third diameter, and wherein said first diameter is greater than said second diameter and said third diameter.

7. The system of claim 1 wherein said alternating electric current has a frequency of at most about 50 kHz.

8. The system of claim 1 wherein said induction heating wire comprises a ferromagnetic material.

9. The system of claim 1 further comprising a spacer positioned between said third segment and said fourth segment.

10. The system of claim 9 wherein said spacer is spirally wrapped around said conductor, axially adjacent to said induction heating wire.

11. The system of claim 9 wherein said spacer comprises a non-ferromagnetic material.

12. The system of claim 1 wherein said first segment, said second segment, said third segment and said fourth segment have a substantially equivalent length.

13. The system of claim 1 wherein said first loop is connected to said second loop at a crossover.

14. The system of claim 1 wherein:
said first segment is connected to said first lead,
said second segment is connected to said second lead,
said third segment is positioned between said second segment and said fourth segment, and
said fourth segment is positioned between said first segment and said third segment.

15. The system of claim 1 further comprising a heating apparatus, wherein said induction heating wire is positioned in said heating apparatus.

16. A method for magnetic characterization of an induction heating wire, said induction heating wire being spirally wrapped around a conductor, said method comprising:

arranging a sensing wire into a first loop and a second loop, said second loop being connected to said first loop at a crossover such that said first loop has a first polarity and said second loop has a second polarity opposite of said first polarity;

positioning said sensing wire along said conductor such that said induction heating wire extends through said first loop, wherein said sensing wire is electrically isolated from said induction heating wire;

positioning a spacer in said second loop;

passing an alternating electric current through said conductor;

sensing said alternating electric current;

sensing a voltage across said sensing wire; and characterizing said induction heating wire based at least on said sensed alternating electric current and said sensed voltage.

17. The method of claim 16 wherein said first loop comprises a first segment and a second segment, wherein said second loop comprises a third segment and a fourth segment, and wherein said first segment, said second segment, said third segment and said fourth segment have a substantially equivalent length.

18. The method of claim 16 wherein said positioning said spacer comprises spirally wrapping said spacer around said conductor.

19. The method of claim 16 wherein said characterizing said induction heating wire comprises calculating a time integral of said sensed voltage.

20. The method of claim 16 wherein said characterizing said induction heating wire comprises generating a B-H curve.

* * * * *